United States Patent
Bayerer et al.

(10) Patent No.: US 10,104,812 B2
(45) Date of Patent: Oct. 16, 2018

(54) ELASTIC MOUNTING OF POWER MODULES

(75) Inventors: Reinhold Bayerer, Warstein (DE); Georg Borghoff, Warstein (DE)

(73) Assignee: Infineon Technologies AG, Neubiberg (DE)

(*) Notice: Subject to any disclaimer, the term of this patent is extended or adjusted under 35 U.S.C. 154(b) by 689 days.

(21) Appl. No.: 13/223,538

(22) Filed: Sep. 1, 2011

(65) Prior Publication Data

US 2013/0056185 A1 Mar. 7, 2013

(51) Int. Cl.
| | |
|---|---|
| *H05K 7/20* | (2006.01) |
| *H01L 33/00* | (2010.01) |
| *H01L 23/36* | (2006.01) |
| *H01L 23/373* | (2006.01) |
| *H01L 23/40* | (2006.01) |
| *H01L 23/00* | (2006.01) |

(52) U.S. Cl.
CPC ............ *H05K 7/209* (2013.01); *H01L 23/36* (2013.01); *H01L 23/3735* (2013.01); *H01L 23/4006* (2013.01); *H01L 23/562* (2013.01); *H01L 24/32* (2013.01); *H01L 2224/291* (2013.01); *H01L 2224/29339* (2013.01); *H01L 2224/29347* (2013.01); *H01L 2224/32225* (2013.01); *H01L 2224/8384* (2013.01); *H01L 2224/83825* (2013.01); *H01L 2924/12042* (2013.01); *Y10T 29/4935* (2015.01)

(58) Field of Classification Search
CPC ....... H01L 2224/48091; H01L 23/4006; H01L 2023/405; H01L 2023/4062; H01L 23/4093; H01L 2023/4081; H01L 2023/4087; H01L 2023/4043

USPC ............... 361/704, 687, 709, 719; 257/719; 438/122, E23.101
See application file for complete search history.

(56) References Cited

U.S. PATENT DOCUMENTS

| | | | |
|---|---|---|---|
| 3,757,271 A | 9/1973 | Judge et al. | |
| 5,172,755 A * | 12/1992 | Samarov | ...................... 165/80.3 |
| 5,379,942 A | 1/1995 | Kuhnert et al. | |
| 5,402,077 A * | 3/1995 | Agahdel et al. | ......... 324/756.02 |
| 5,901,039 A * | 5/1999 | Dehaine | .............. H01L 23/4006 257/719 |
| 5,901,748 A * | 5/1999 | Jessop | ................... F16K 11/074 137/625.11 |
| 6,112,378 A * | 9/2000 | Lee | ................................ 24/458 |
| 6,307,748 B1 * | 10/2001 | Lin | ..................... H01L 23/4093 165/80.3 |
| 6,331,937 B1 * | 12/2001 | Bartyzel | ............. H01L 23/4093 257/718 |

(Continued)

*Primary Examiner* — Eva Yan Montalvo
*Assistant Examiner* — David Goodwin
(74) *Attorney, Agent, or Firm* — Murphy, Bilak & Homiller, PLLC

(57) ABSTRACT

A semiconductor module includes a base plate having an inner region adjacent an edge region, a substrate attached to the inner region of the base plate and a heat sink on which the base plate is mounted so that the base plate is interposed between the substrate and the heat sink and at least part of the inner region of the base plate contacts the heat sink. The module further includes a stress relief mechanism configured to permit the base plate to bend away from the heat sink in the edge region responsive to a thermal load so that at least part of the inner region of the base plate remains in contact with the heat sink.

1 Claim, 9 Drawing Sheets

(56) References Cited

U.S. PATENT DOCUMENTS

| | | | | |
|---|---|---|---|---|
| 6,654,250 B1* | 11/2003 | Alcoe | ............... | H05K 1/189 |
| | | | | 257/719 |
| 6,992,893 B2* | 1/2006 | Miyamura | ......... | H01L 23/4093 |
| | | | | 165/80.3 |
| 7,632,716 B2* | 12/2009 | Muraki | ............... | H01L 23/66 |
| | | | | 257/E23.101 |
| 7,728,231 B2* | 6/2010 | Matsui et al. | ............... | 174/252 |
| 7,906,731 B2* | 3/2011 | Matsui | ............... | F21V 19/0055 |
| | | | | 174/252 |
| 7,978,475 B2* | 7/2011 | Urai | ............... | H01L 23/4006 |
| | | | | 165/80.3 |
| 2006/0245165 A1* | 11/2006 | Lin | ............... | H01L 23/4006 |
| | | | | 361/704 |
| 2008/0002367 A1* | 1/2008 | Gilliland | ......... | H01L 23/552 |
| | | | | 361/709 |
| 2008/0043473 A1 | 2/2008 | Matsui | | |
| 2008/0079145 A1 | 4/2008 | Tschirbs et al. | | |

\* cited by examiner

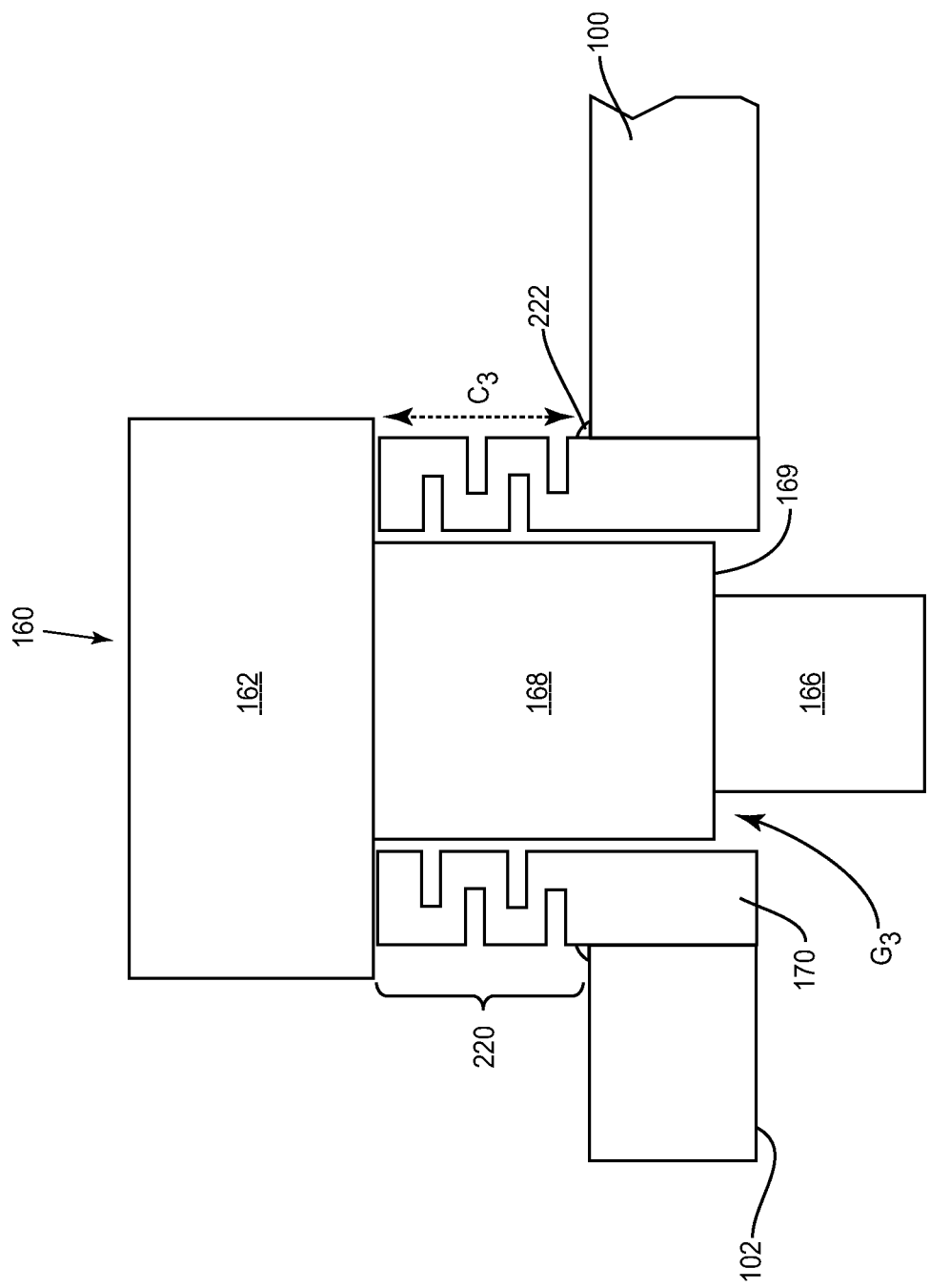

ELASTIC MOUNTING OF POWER MODULES

TECHNICAL FIELD

The present application relates to assembling semiconductor modules, in particular assembling semiconductor modules having components with different thermal expansion coefficients.

BACKGROUND

Power semiconductor modules typically include a base plate which is pre-bent to have a convex shape after one or more substrates are joined to the base plate. The convex shape provides better thermal impedance after mounting the opposite side of the base plate to a heat sink. A thermal interface material is provided between the substrate and base plate, and becomes a relatively thin layer in case of a convex shape of the base plate. During mounting with screws which are placed along edges of the base plate, the base plate is bent downward at the edges to be more or less flat with the heat sink. The bending of the base plate results in a bending of the substrate and semiconductor die mounted on the substrate.

Depending on the kind of joining process and conditions employed, the joining layer between base plate and substrate may be coplanar to the base plate, convex or concave shaped. As such, the substrate does not necessarily have a flat shape after joining to the base plate. In any case the bending of the base plate and related bending of the substrate under a thermal load may cause cracks to propagate in the ceramic substrate. Another stress results from the thermal load. Due to a thermal expansion mismatch between the substrate and base plate, the entire module is predisposed to become more convex under thermal loading. The base plate cannot bend under a thermal load because the base plate is fixedly clamped flat on the heat sink. Thus the stress within the substrate (particularly in the ceramic material of the substrate) rises even further during heating, causing additional cracking and damage.

Another problem arises due to the thermal expansion mismatch. The thermal interface material provided between the base plate and substrate tends to be paste-like. As the deformation of the entire module system during heating is complex, heating and cooling may cause the thermal interface material to be pumped out from between the substrate and base plate. The thermal resistance of the interface between the base plate and substrate increases as more thermal interface material is pumped out, degrading the overall thermal performance of the module.

SUMMARY

Mounting means are provided which limit the force applied to the base plate of a semiconductor module, allowing the base plate to have a convex shape for good thermal impedance but limiting the bending during mounting. In case of a maximum force that is reached at the screws or clamps used to mount the base plate to a heat sink, the edges of the base plate may lift away from the heat sink e.g. by some 10 µm or a few 100 µm. Still the pressure stays at the inner region of the base plate where devices i.e. substrate(s) with semiconductor die are assembled. The pump out effect of thermal interface material from the inner module region is reduced as the entire base plate is no longer held flat on the heat sink. The embodiments described herein limit the force at mounting points of the base plate, limit bending of the base plate during mounting, limit the stress produced by heating, provide stress relief for the entire module system and provide an optimum pre-bending of the base plate.

According to an embodiment of a semiconductor module, the module includes a base plate having an inner region adjacent an edge region, a substrate attached to the inner region of the base plate and a heat sink on which the base plate is mounted so that the base plate is interposed between the substrate and the heat sink and at least part of the inner region of the base plate contacts the heat sink. The module further includes a stress relief mechanism configured to permit the base plate to bend away from the heat sink in the edge region responsive to a thermal load so that at least part of the inner region of the base plate remains in contact with the heat sink.

According to an embodiment of a method of manufacturing a semiconductor module, the method includes: providing a base plate having an inner region adjacent an edge region; attaching a substrate to the inner region of the base plate; mounting the base plate onto a heat sink so that the base plate is interposed between the substrate and the heat sink and at least part of the inner region of the base plate contacts the heat sink; and providing a stress relief mechanism configured to permit the base plate to bend away from the heat sink in the edge region responsive to a thermal load so that at least part of the inner region of the base plate remains in contact with the heat sink.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 4*a* to 4*c* illustrate yet another embodiment of a method of manufacturing a semiconductor module.

DETAILED DESCRIPTION

Figure 1:
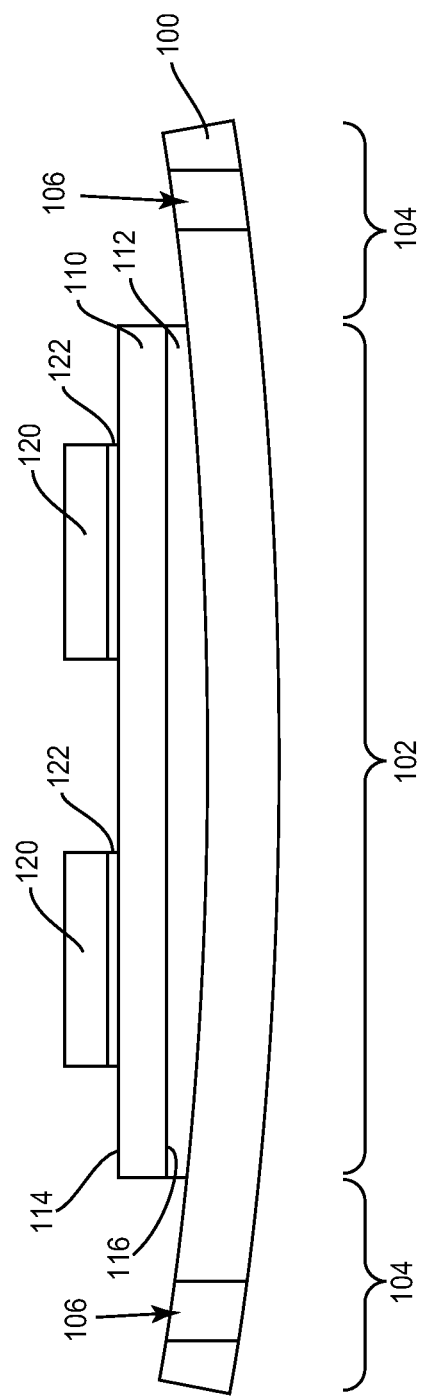
FIGS. 1 and 2 illustrate an embodiment of a method of manufacturing a semiconductor module.
Figure 2:
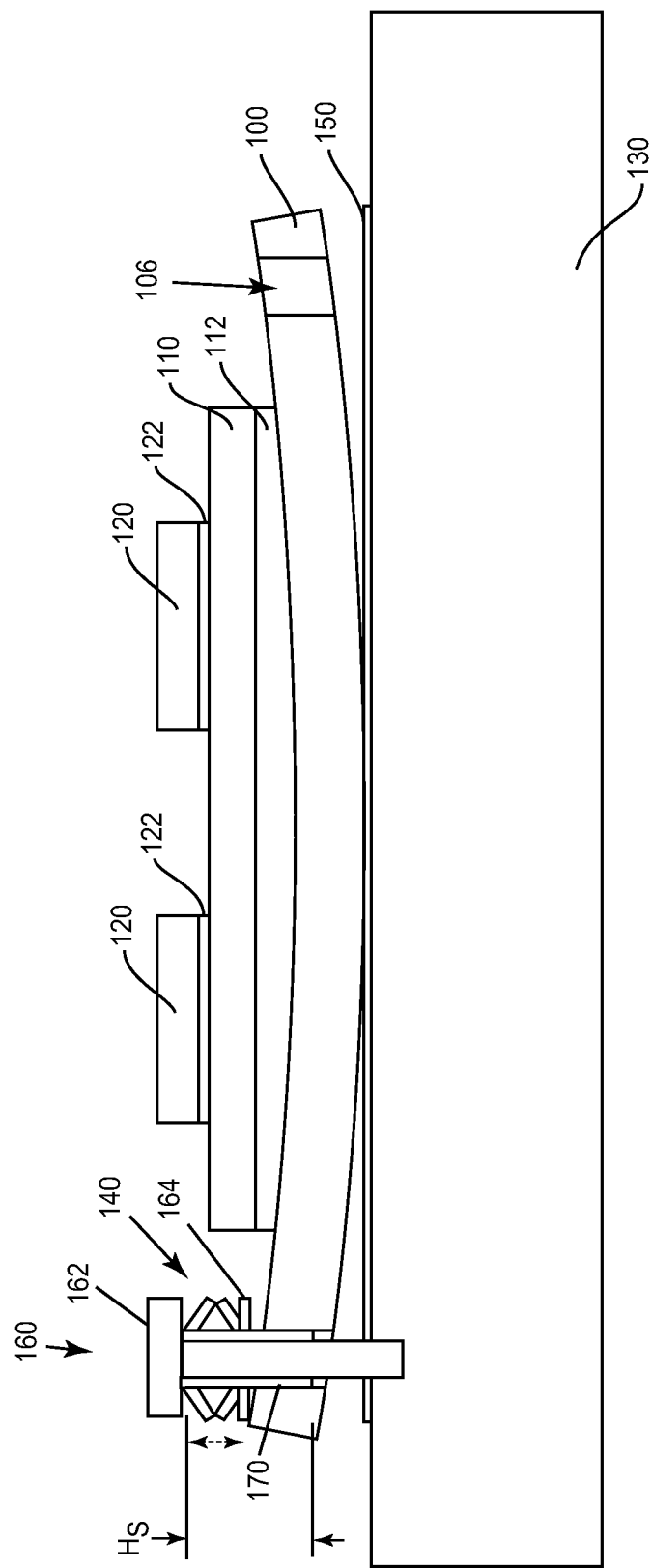

FIGS. 1 and 2 illustrate an embodiment of a method of manufacturing a semiconductor module. In FIG. 1, a thermally conductive base plate 100 is provided which has an inner region 102 adjacent an edge region 104. The base plate 100 has an initial convex shape in that the base plate 100 is curved or rounded outward i.e. the edge region 104 is bent outward further than the inner region 102. A substrate 110 is attached to the inner region 102 of the base plate 100 using any conventional substrate attach material 112 e.g. such as solder, etc. One or more semiconductor die 120 are attached to the top surface 114 of the substrate 110 so that the substrate 110 is interposed between the die 120 and the base plate 100. The die 120 may be attached to the substrate 110 using any conventional die attach material 122 such as solder, diffusion solder, sintered silver, sintered Cu etc. The substrate 110 can be, for example, a DCB substrate (DCB=Direct Copper Bonding) or a DAB substrate (DAB=Direct Aluminum Bonding) or an AMB substrate (AMB=Active Metal Brazing) with a ceramic material interposed between top and bottom metallizations, and with the bottom metallization soldered, brazed, etc. to the inner region 102 of the base plate 100. In each case, the base plate 100 retains its convex shape after substrate mounting. As such, the material 112 used to attach the bottom 116 of the substrate 110 to the base plate 100 has an elliptical shape as shown in FIG. 1. In general, the shape of the base plate 100 can be more complex but the overall shape can be described as convex or elliptical.

FIG. 2 shows the base plate 100 with the substrate 110 during mounting onto a heat sink 130. The base plate 100 is mounted on the heat sink 130 so that the base plate 100 is interposed between the substrate 110 and the heat sink 130 and at least part of the inner region 102 of the base plate 100 contacts the heat sink 130. The edge region 104 of the base plate 100 is bent downward from its initial position toward the heat sink 130 during the mounting process. In one embodiment, the entire base plate 100 is mounted flat against the heat sink 130—with some deviation from flatness according to the complex thermo-mechanical stress after assembly of the substrate 110. In an alternative embodiment, less force is applied during the heat sink mounting process so that the base plate 100 retains a convex shape (although less pronounced than originally provided) with the inner region 102 of the base plate 100 pressed against the heat sink 130 and the edge region 104 spaced apart from the heat sink 130.

In either case, the base plate 100 has a modified shape compared to its initial form. A stress relief mechanism is provided which permits the base plate 100 to bend away from the heat sink 130 in the edge region 104 and back toward its initial shape responsive to a thermal load applied to the module so that at least part of the inner region 102 of the base plate 100 remains in contact with the heat sink 130 during thermal loading. This way, less stress is imparted on the substrate 110 in view of the stress relief provided by the base plate bending via the stress relief mechanism. Also, the thermal interface material 150 between the base plate 100 and the heat sink 130 is not pumped out along the inner region 102 of the base plate 100 since the inner region 102 remains in contact with the heat sink 130 regardless of thermal loading conditions.

In one embodiment, the base plate 100 is mounted to the heat sink 130 using a fastener 160 such as a screw or bolt which is inserted into the heat sink 130 through an opening 106 in the base plate 100. The stress relief mechanism can be a spring washer 140 interposed between the base plate 100 and the head 162 of the fastener 160 according to this embodiment e.g. as shown in FIG. 2. The spring washer 140 compresses when the force applied by the base plate 100 under a thermal load exceeds a certain threshold, and relaxes when the thermal load reduces or subsides as indicated by the dashed line with end arrows. By compressing in this way, the spring washer 140 allows the base plate 100 to bend in the edge region while ensuring at least part of the inner region of the base plate remains in contact with the heat sink during thermal loading. An additional washer 164 can be provided between the bottom of the spring washer and the base plate as shown in FIG. 2.

A spacer can be provided for maintaining a gap between the edge region 104 of the base plate 100 and the heat sink 130 after mounting. According to one embodiment, the spacer is a hollow cylinder 170 e.g. as shown in FIG. 2. The hollow cylinder 170 is inserted into the opening 106 formed in the base plate 100 during assembly and receives the fastener 160. The height ($H_S$) of the hollow cylinder 170 is selected to prevent the edge region 104 of the base plate 100 from contacting the heat sink 130 after heat sink mounting by limiting the depth at which the fastener 160 can move toward the heat sink 130. As such, the base plate 100 retains a convex shape (although less pronounced than originally provided) with the edge region 104 bent away from the heat sink 130 according to this embodiment.

Figure 3A:
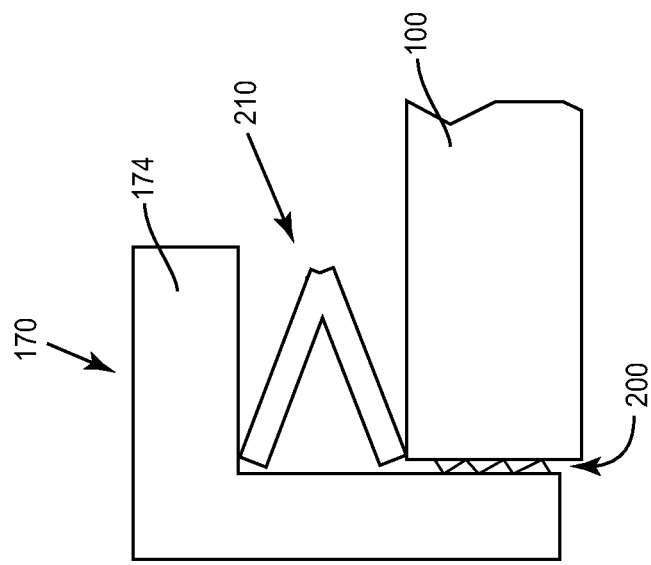
FIGS. 3*a* and 3*b* illustrate another embodiment of a method of manufacturing a semiconductor module.
Figure 3A:
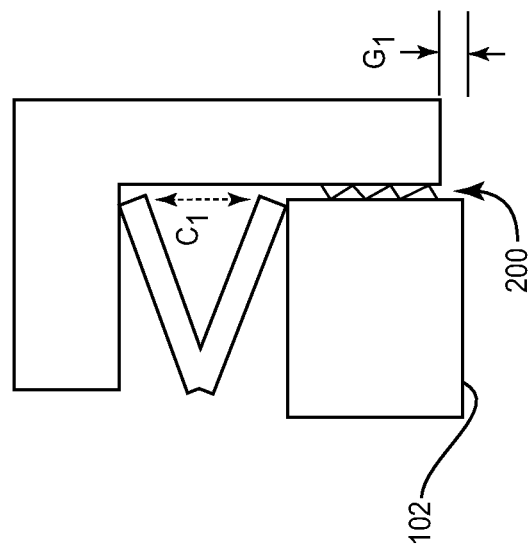

FIG. 3a illustrates the semiconductor module in a section of the edge region 104 of the base plate 100, prior to heat sink mounting. According to this embodiment, the hollow cylinder 170 is press-fit into the opening 106 formed in the base plate 100. Press-fitting is a known metal-to-metal connection technique where the contact faces 200 of the objects are force fitted together. The hollow cylinder 170 is press-fit into the base plate 100 in such a way so that the bottom end 172 of the hollow cylinder 170 does not extend to the bottom side 102 of the base plate 100, resulting in a gap G1 between the bottom end 172 of the hollow cylinder 170 and the bottom side 102 of the base plate 100. The press-fit connection also causes the spring washer or other elastic object 210 interposed between the head 174 of the hollow cylinder 170 and the base plate 100 to become compressed to a point C1.

Figure 3B:
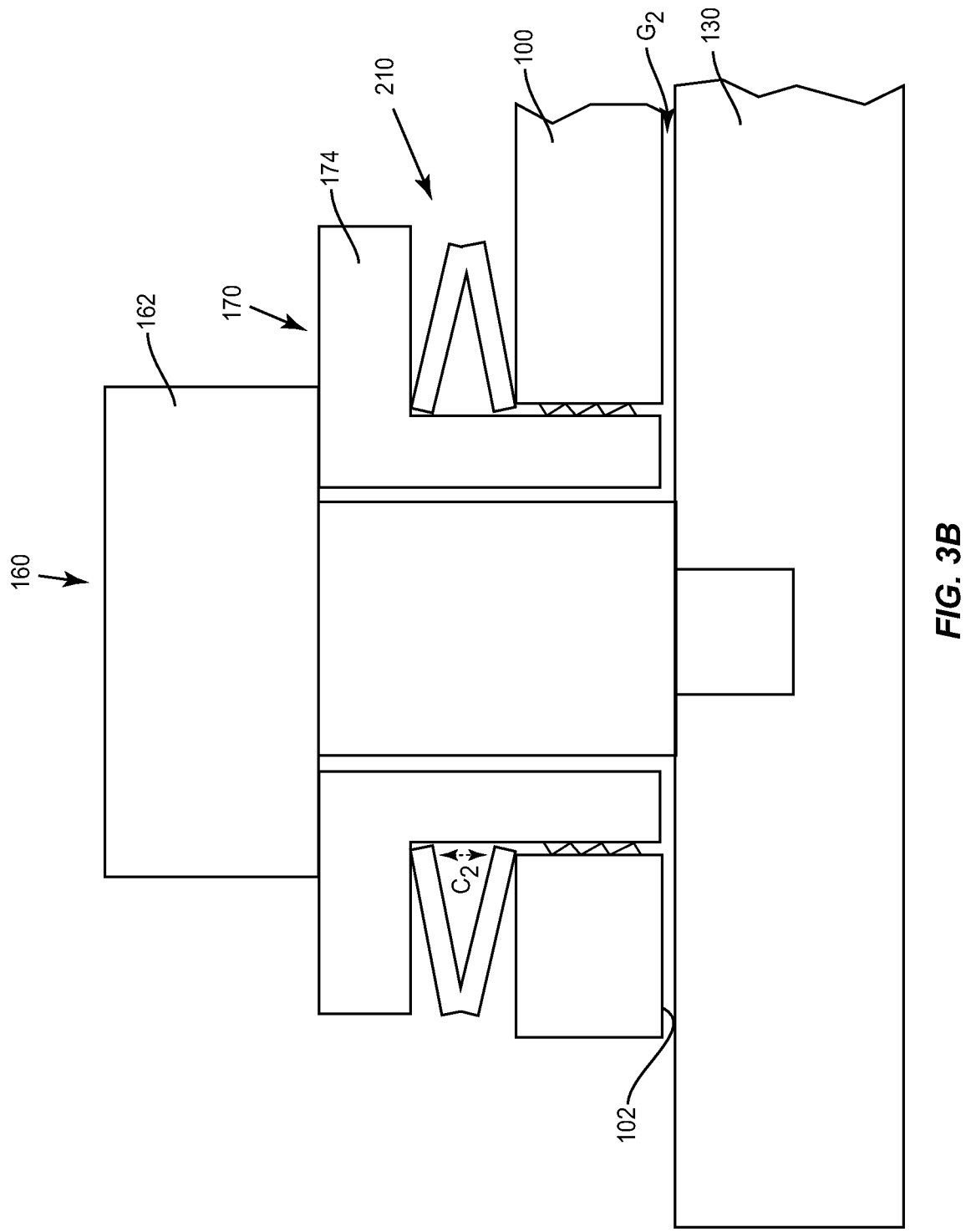

FIG. 3b shows the semiconductor module of FIG. 3a after heat sink mounting via a fastener 160 such as a bolt or screw. The fastener 160 is inserted through the hollow cylinder 170 and received by the heat sink 130. The gap G1 between the bottom end 172 of the hollow cylinder 170 and the bottom side 102 of the base plate 100 may close during the heat sink mounting process as shown in FIG. 3b if the hollow cylinder 170 is further press-fit into the base plate 100 by the fastener 160. Alternatively the press-fit connection between the hollow cylinder 170 and the base plate 100 may withstand the force applied by the fastener 160, and the gap G1 may remain after heat sink mounting. In either case, securing the fastener 160 to the heat sink 130 causes the spring washer or other elastic object 210 to further compress to a point C2 which results in a mounting force being applied onto the base plate 100. This mounting force causes the base plate 100 to bend downward by some amount. A gap G2 may still remain between the bottom side 102 of the base plate 100 and the heat sink 130 after heat sink mounting as shown in FIG. 3b. This gap G2 is caused by the counter force of the convex shaped base plate 100. The amount of gap G2 is determined by the equilibrium of pressure from the spring washer or other elastic object 210 and the bending force of the base plate 100. This gap G2 increases when the module and heat sink 130 subsequently heat up during use. The spring washer or other elastic object 210 further compresses under such a thermal load beyond point C2 as explained above and subsequently relaxes when the thermal load reduces or subsides, allowing the base plate 100 to bend away from the heat sink 130 at the edge region 104 under the thermal load and at least partly return to its original shape when the thermal load reduces or subsides.

Figure 4A:
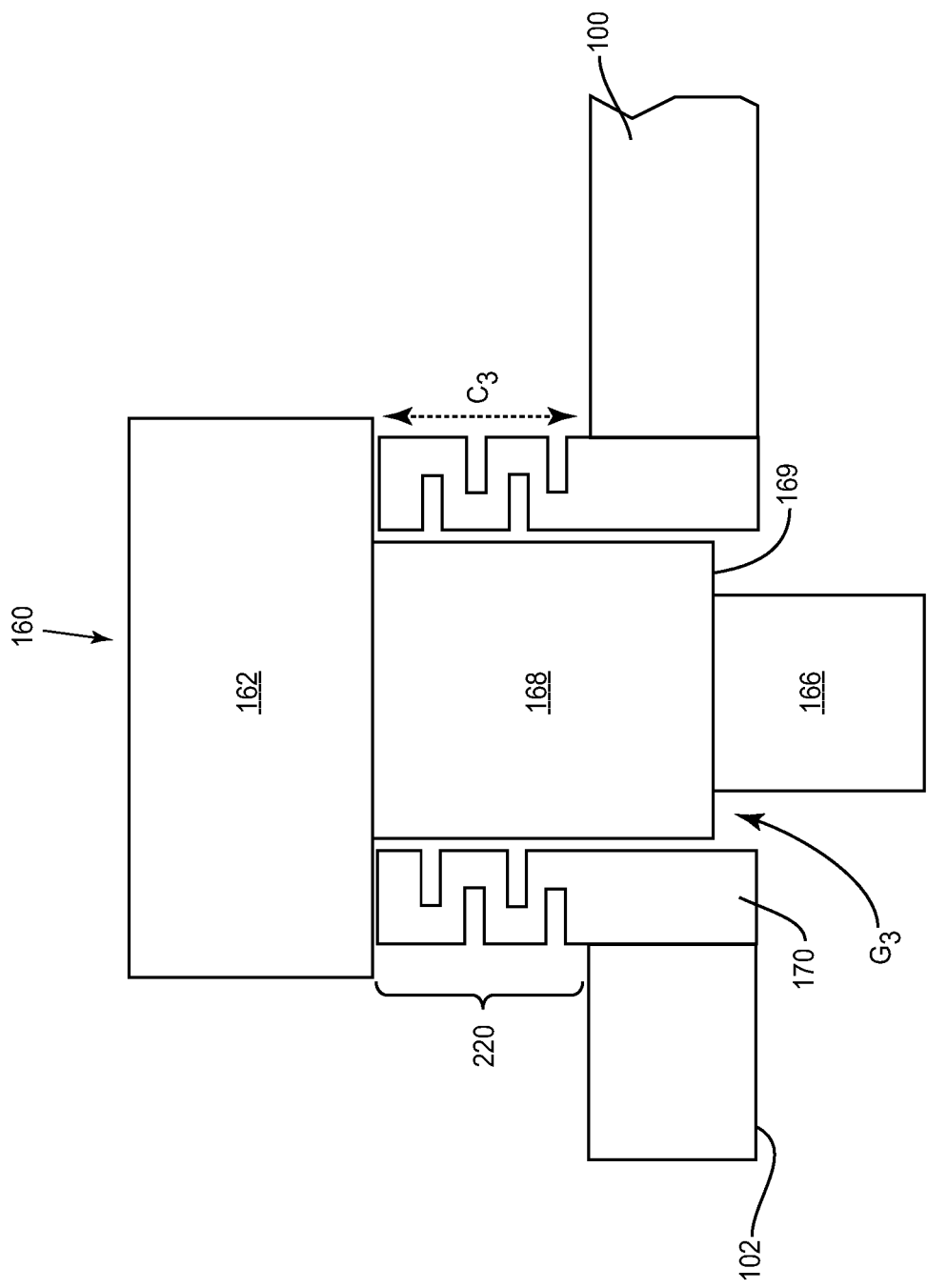

FIG. 4a illustrates another embodiment of the semiconductor module in a section of the edge region 104, prior to heat sink mounting. A fastener 160 such as a bolt or screw is provided to fix the base plate 100 to the heat sink 130 through an opening 106 in the base plate 100. The fastener 160 has a head 162, a lower narrower section 166 and an upper wider section 168 interposed between the head 162 and the lower section 166. The upper wider diameter section 168 of the fastener 160 serves as a distance holder and ensures a gap G3 exists between the bottom side 102 of the base plate 100 and the bottom 169 of the wider diameter section 168 of the fastener 160.

FIG. 4b shows the semiconductor module of FIG. 4a after the hollow cylinder 170 is joined to the base plate 100 according to an embodiment. The hollow cylinder 170 can be joined to the base plate 100 using any suitable conventional technique. For example, the hollow cylinder 170 can have a press-fit connection with the base plate 100 as explained previously herein. Alternatively, a laser weld 222 can be used to join the hollow cylinder 170 to the base plate 100 as shown in FIG. 4b. In each case, the stress relief mechanism is provided as an elastic object 220 such as a spring washer in contact with the head 162 of the fastener 160 and interposed between the hollow cylinder 170 and the head 162 of the fastener 160. In one embodiment, the elastic object 220 is an integral part of the hollow cylinder 170. In another embodiment, the elastic object 220 is a separate part positioned on the hollow cylinder 170 during assembly. In either case the elastic object 220 compresses under a thermal load and relaxes when the thermal load reduces or subsides, allowing the base plate 100 to bend away from the heat sink 130 at the edge region 104 under the thermal load. The elastic object 220 is shown in an uncompressed state C3 prior to heat sink mounting in FIGS. 4a and 4b.

Figure 4C:
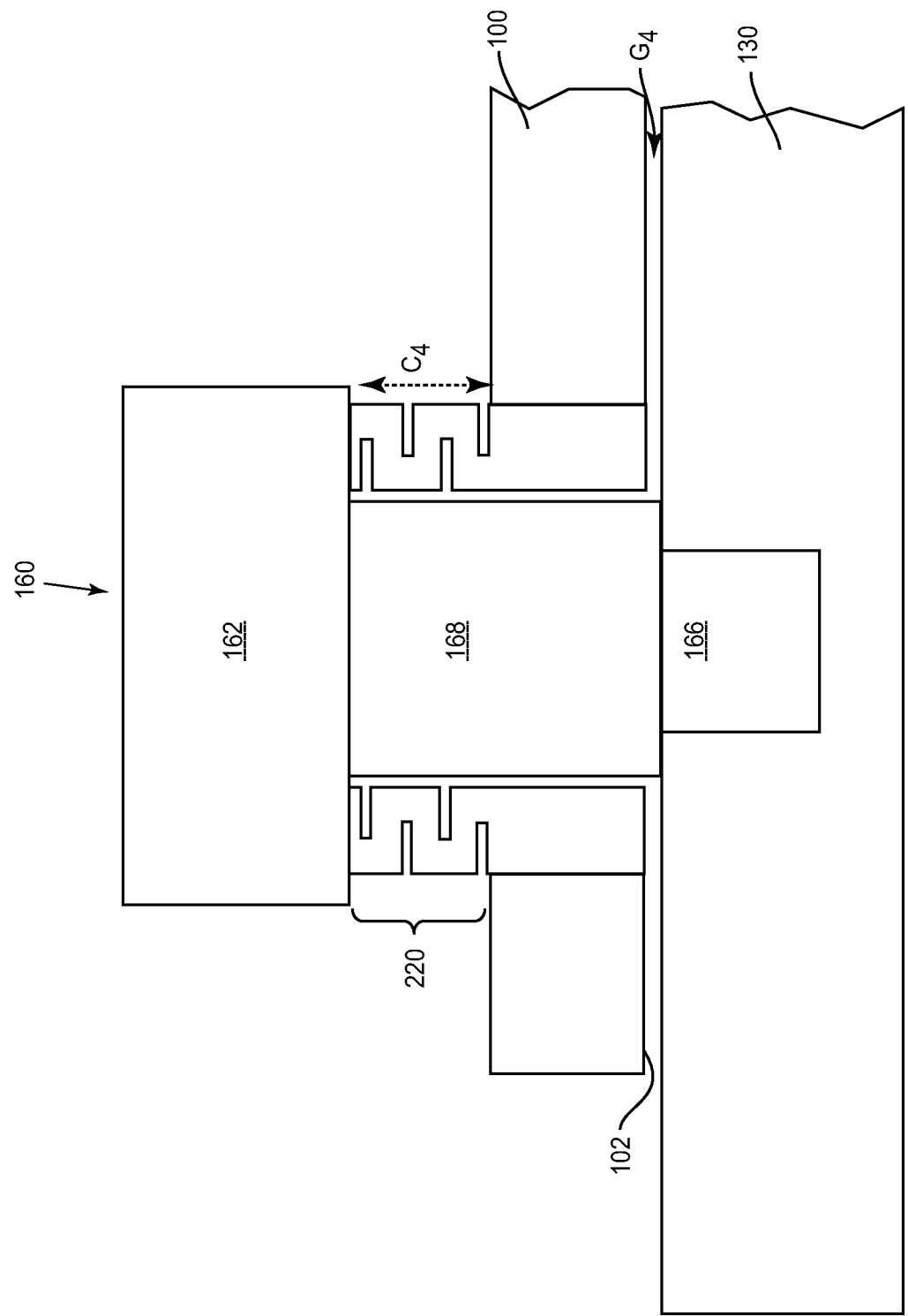

FIG. 4c shows the semiconductor module of FIG. 4a after heat sink mounting. The gap G3 shown in FIG. 4a results in the elastic object 220 becoming compressed to a point C4 during the heat sink mounting process, thus causing pressure to be applied onto the base plate 100. This pressure in turn forces the base plate 100 to bend downward toward the heat sink 130. A gap G4 between the bottom side 102 of the base plate 100 and the heat sink 130 is caused by the counter force of the convex shaped base plate 100. The amount of gap G4 is determined by the equilibrium of pressure from the elastic object 220 and the bending force of the base plate 100. The gap G4 increases with rising temperature of the base plate 100 during use, as the elastic object 220 further compresses beyond point C4.

Figure 5:
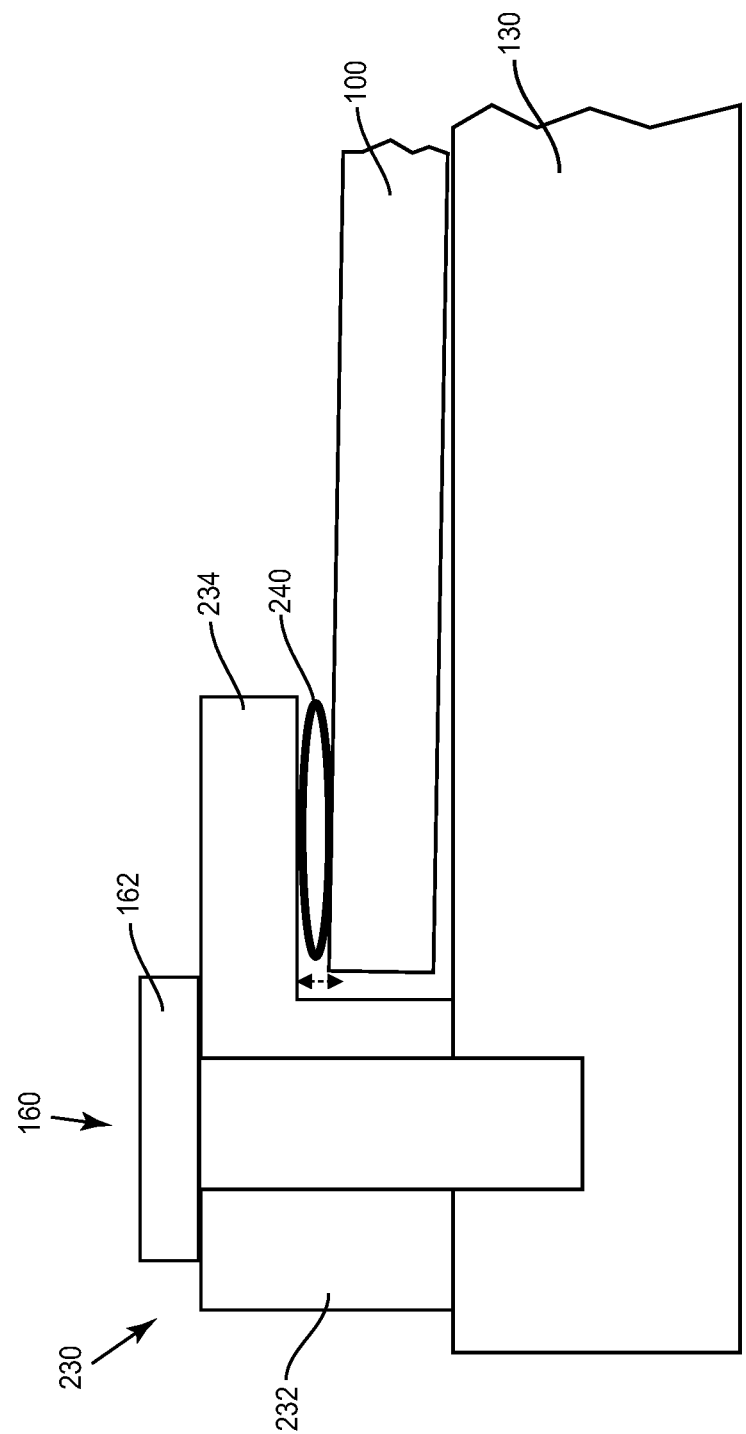
FIG. 5 illustrates yet another embodiment of a semiconductor module.

FIG. 5 illustrates yet another embodiment of the semiconductor module in a section of the interface between the heat sink 130 and the edge region 104 of the base plate 100. A clamp 230 is employed to hold the base plate 100 in place against the heat sink 130. The clamp 230 includes a base 232 and a rigid arm 234 extending laterally outward from the base 232 over the edge region 104 of the base plate 100. The clamp base 232 is sized so that the edge region 104 of the base plate 100 is spaced apart from the heat sink 130 after a fastener 160 is used to secure the clamp 230 to the heat sink 130 as shown in FIG. 5. The arm 234 of the clamp 230 is rigid in that the arm 234 does not move in response to an applied force. To permit the base plate 100 to bend in the edge region 104 under a thermal load as previously described herein, the stress relief mechanism is provided as an elastic object 240 interposed between the base plate 100 and the rigid arm 234 of the clamp 230. The elastic object 240 compresses under the thermal load and relaxes when the thermal load reduces or subsides as indicated by the dashed line with end arrows, allowing the base plate 100 to bend away from the heat sink 130 at the edge region 104 under the thermal load.

Figure 6:
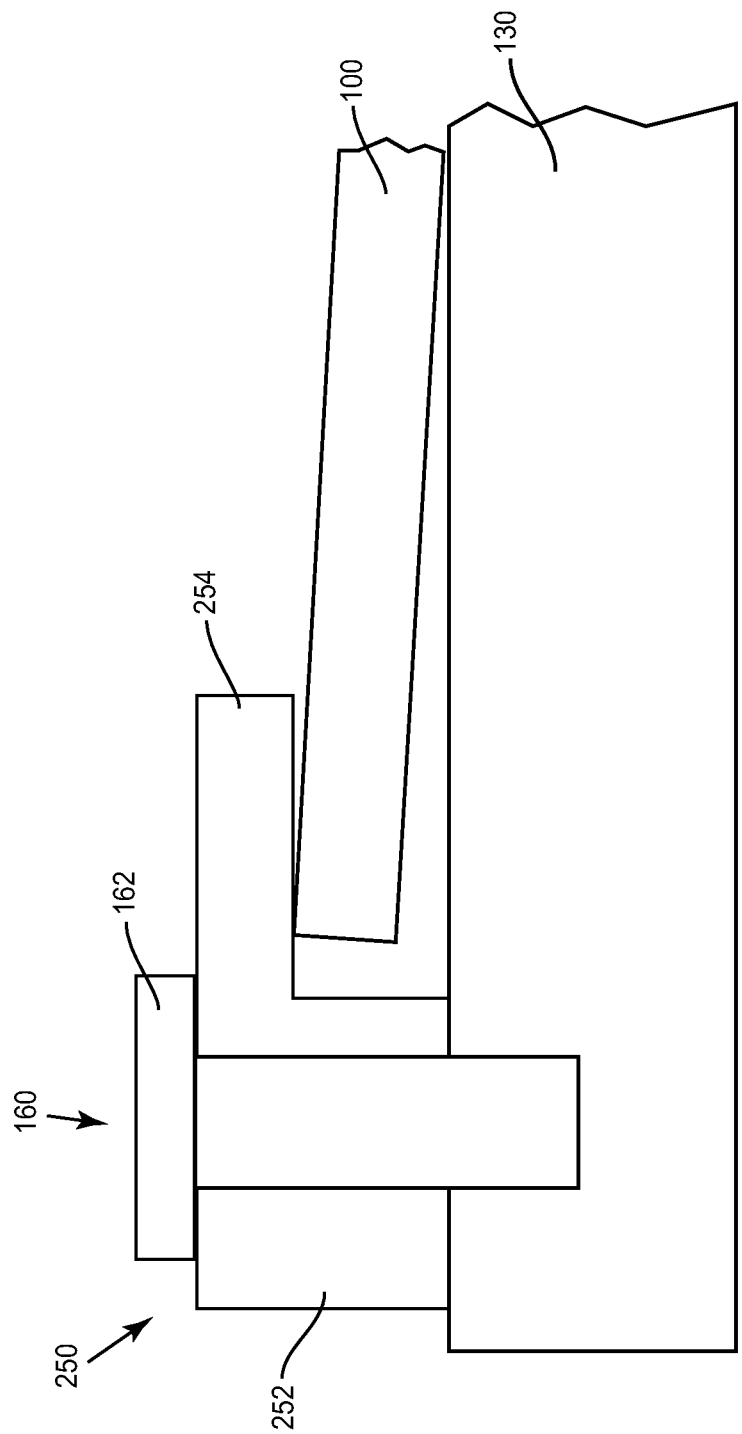
FIG. 6 illustrates still another embodiment of a semiconductor module.

FIG. 6 illustrates still another embodiment of the semiconductor module in a region of the interface between the heat sink 130 and the edge region 104 of the base plate 100. A clamp 250 is employed to hold the base plate 100 in place against the heat sink 130. The clamp 250 includes a base 252 and a flexible arm 254 extending laterally outward from the base 252 over the edge region 104 of the base plate 100. The clamp base 252 is sized so that the edge region 104 of the base plate 100 is spaced apart from the heat sink 130 after a fastener 160 is used to secure the clamp 250 to the heat sink 130 as shown in FIG. 6. According to this embodiment, the stress relief mechanism is the flexible arm 254 of the clamp 250. The arm 254 of the clamp 250 is flexible in that the arm 254 moves upward in response to a corresponding force exerted by the base plate 100 under a thermal load and returns to its relaxed position after the applied force subsides, allowing the base plate 100 to bend away from the heat sink 130 at the edge region 104 under the thermal load as indicated by the dashed line with end arrows.

For substrates having a ceramic material, the stress relief mechanism described herein limits the force applied to the substrate under a thermal load to below the maximum bending strength of the ceramic material, e.g. to below half the maximum bending strength of the ceramic. This way, damage to the substrate is avoided or at least significantly reduced. Typical bending strength of a ceramic-based substrate is in the range of 200 to 500 MPa, and for high performance ceramics is up to 1000 MPa.

In some embodiments described herein, the base plate is mounted to the heat sink via a fastener inserted through an opening in the base plate. According to these embodiments, the stress relief mechanism limits the force applied to the base plate via the fastener to less than 2000 N, e.g. to less than 1000 N, e.g. to less than 500 N.

The stress relief mechanism can permit the base plate to bend away from the heat sink in the edge region by at least 10 μm responsive to a thermal load. In one embodiment, the stress relief mechanism permits the base plate to bend away from the heat sink in the edge region by at least 100 μm responsive to a thermal load.

More than one substrate may be attached to the inner region of the base plate. Also, the base plate may have any desired shape e.g. such as square, rectangular, U-shaped, etc.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module, comprising:
   a base plate having an inner region adjacent an edge region;
   a substrate attached to the inner region of the base plate;
   a heat sink on which the base plate is mounted so that the base plate is interposed between the substrate and the heat sink and at least part of the inner region of the base plate contacts the heat sink; and
   a stress relief mechanism configured to permit the base plate to bend away from the heat sink in the edge region if a force applied by the base plate exceeds a certain threshold under a thermal load so that at least part of the inner region of the base plate remains in contact with the heat sink,
   wherein the stress relief mechanism comprises a spring washer interposed between the base plate and a head of a fastener, the fastener attaching the base plate to the heat sink through an opening in the base plate, and
   wherein the fastener is secured to the heat sink through a hollow cylinder press-fit into the opening in the base plate, the hollow cylinder configured to provide a gap between the edge region of the base plate and the heat sink by limiting the depth at which the fastener can move towards the heat sink when the fastener is secured to the heat sink.

* * * * *